United States Patent
Langari et al.

(10) Patent No.: US 6,848,500 B1
(45) Date of Patent: Feb. 1, 2005

(54) COOLING SYSTEM FOR PULSED POWER ELECTRONICS

(75) Inventors: Abdolreza Langari, Newport Beach, CA (US); Seyed Hassan Hashemi, Laguna Niguel, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 276 days.

(21) Appl. No.: 09/266,376

(22) Filed: Mar. 11, 1999

(51) Int. Cl.[7] .............................................. F28D 15/00
(52) U.S. Cl. ................... 165/104.33; 165/10; 165/902; 361/699; 257/714
(58) Field of Search ..................... 165/10, 902, 104.33, 165/46; 361/699; 257/714

(56) References Cited

U.S. PATENT DOCUMENTS

| | | | | |
|---|---|---|---|---|
| 3,780,356 A | * | 12/1973 | Laing ...................... | 165/902 X |
| 4,057,101 A | * | 11/1977 | Ruka et al. ............. | 165/902 X |
| 4,178,727 A | * | 12/1979 | Prusinski et al. ....... | 165/902 X |
| 4,612,978 A | * | 9/1986 | Cutchaw .................. | 165/46 X |
| 5,007,478 A | * | 4/1991 | Sengupta ................ | 165/902 X |
| 5,245,508 A | * | 9/1993 | Mizzi ....................... | 165/46 X |
| 5,455,458 A | | 10/1995 | Quon et al. .................. | 257/714 |

FOREIGN PATENT DOCUMENTS

| EP | 0 732 743 A2 | 3/1996 |
|---|---|---|
| WO | WO 00/05970 | 7/1999 |

OTHER PUBLICATIONS

Steven A. Dittman and Mahesh Kumar, *Mimic Temperature Stabilization Through Phase Change Energy Absorption*, 1990, pp. 617–620.

IBM Technical Disclosure Bulletin, *Phase–Change Thermal Pack for Portable Computing Systems*, 38 (1995) Aug., No. 8, p. 627.

IBM Technical Disclosure Bulletin, *Liquid Piston with Phase Change to Absorb Thermal Transients*, Oct. 1995, vol. 38, No. 10, p. 69.

Machine Design, *Melting Wax Cools Hot Components*, Oct. 10, 1985, p. 48.

* cited by examiner

*Primary Examiner*—Christopher Atkinson
(74) *Attorney, Agent, or Firm*—Farjami & Farjami LLP

(57) ABSTRACT

The invention discloses an apparatus for reducing peak temperatures and thermal excursions, of semiconductor devices, particularly in pulsed power applications. The apparatus comprises thermally coupling Phase Change Material (PCM) to the dissipating semiconductor device. PCM absorbs heat and stays at a constant temperature during its phase change from solid to liquid. The PCM melting point is chosen so that it is just below the temperature the device would otherwise achieve. When the device approaches the maximum temperature, the PCM melts, drawing heat from the device and lowering the device's peak temperature. As the device stops dissipating, after its pulse period, the PCM material solidifies releasing the heat it absorbed. The apparatus lowers the peak temperature by absorbing heat when the device is dissipating. The apparatus also keeps the semiconductor device from cooling off as much as it would cool without the apparatus, as the PCM material releases heat during the part of the cycle when it is re-solidifying, i.e. when the pulse power is off. By lowering the peak temperature the device achieves, and increasing the temperature of the device when it is in the off portion of its pulsed power cycle the temperature excursions of the device during operation are reduced. By reducing the temperature swings, that the device sees during operation, the thermal stress is reduced and the reliability of the device is improved.

14 Claims, 13 Drawing Sheets

COOLING SYSTEM FOR PULSED POWER ELECTRONICS

FIELD OF THE INVENTION

The present invention relates, generally, to electronic power devices which are operated in a pulsed mode, and, in particular embodiments to personal communications systems, processes and devices which minimize temperature stress within pulsed power circuitry by thermally buffering transient power dissipation.

DESCRIPTION OF THE RELATED ART

Portable electronic devices have become part of many aspects of personal, business, and recreational activities and tasks. The popularity of various portable personal electronic communications systems, such as portable phones, portable televisions, and personal pagers, continues to increase. As the popularity of portable electronic systems has increased, so has the demand for smaller, lighter, more powerful and more power efficient devices.

Amplification of electronic signals is a function performed in many portable electronic systems. Amplification circuitry and semiconductor devices tend to generate significant amounts of heat. The continually shrinking packaging, containing the amplification circuitry and devices, has tended to reduce the ability of these devices to dissipate heat through convection. The space surrounding these devices has become significantly more confined as packaging sizes shrink, thereby reducing the opportunity for convection currents to circulate and remove heat. In addition the packaging for these smaller, lighter electronics devices is being made, in significant part, of materials such as plastics, which are generally lighter than metal packaging. Plastics, relative to metals, however, generally tend to have a greater thermal resistance to heat transfer. The opportunity for heat transfer, and the cooling of the power circuitry via conduction, may be significantly reduced by the increasing use of non metallic materials.

Reliability of semiconductor devices is related to the temperature of the devices. Manufacturers of portable electronic systems have sought to reduce the amount of heat generated by the semiconductor devices within those systems, and to spread the heat that is generated, in order to reduce peak temperatures which would affect the reliability of the semiconductor devices within those systems. Manufacturers have made efforts to reduce or spread the heat within power devices, which tend to generate a significant amount of heat.

Some manufacturers of power devices have taken the approach of adding metal heat sinks to their power devices. Because the effectiveness of the heat sinking diminishes, however, with the air volume available for convection cooling surrounding the heat sink, the reduction of volume in the smaller electronic packages reduces the effectiveness of this technique.

Another method of reducing power consumption, and therefore heat generation, is to employ a digital design. Digital communications systems are, in large part, replacing analog communication systems. This is so because digital systems, generally, can offer increased performance and lower overall power consumption than analog systems. Digital systems commonly operate in a time sharing mode or pulse mode. That is a digital system will turn on, broadcast data and then turn off. This time sharing mode allows several communications systems to share the same frequency without interfering with each other. A time sharing system can also lower over all power dissipation of a communication system, because it operates for only a fraction of the time that a continuous system operates. The rapid cycling on and off of the output of the time sharing system can, however, give rise to significant peak power dissipation. The rapid power cycling of devices can lead to continual thermal stress as the devices are turned on, dissipate considerable power, and then are turned off. In the confined space of a personal communication device, such as a portable telephone, the temperature swings due to the rapid cycling of power can lead to significant, continuous mechanic al stress on the semiconductor devices, circuit connections, wire bonds, and other mechanical connections. This there is a need to reduce the mechanical stress, induced by power cycling, to increase overall reliability in digital time sharing or pulse mode communication system and other power cycling applications.

SUMMARY OF THE DISCLOSURE

To overcome the limitations in the prior art described above, and to overcome other limitations that will become apparent upon reading and understanding the present specification, preferred embodiments of the present invention relate to thermal management apparatus and methods applicable to solid state devices operating in pulse modes.

Accordingly, preferred embodiments of the present invention involve reducing thermal stress produced by power cycling in solid state systems, such as communication devices. Embodiments described herein buffer heat from the power dissipating circuits through the use of integrated circuit or circuit component chip configurations, which employ a heat absorbing material as an element of the embodiment. To facilitate the removal of heat, embodiments of the disclosure employ a Phase Change Material (PCM) as part of the heat removal mechanism. The PCM material removes heat from the device, without a corresponding increase in temperature, by changing phase from a solid to a liquid. By having the phase change occur near the maximum, operational, temperature of a device, the melting of the PCM occurs just prior to the maximum operational temperature of the device being reached. During a phase change, the PCM absorbs heat without a corresponding increase in temperature. By absorbing heat just prior to the point where the maximum operational temperature would be reached, the maximum temperature actually reaches can be reduced.

By reducing the peak temperature of the device the overall stress on the device is reduced, thereby increasing the overall reliability of the device.

Embodiments of the disclosure can be applied to individual transistors, multichip modules—such as those power amplifier multichip modules found in portable phones, or even integrated circuits which turn various portions of the integrated circuit on and off.

The technique of applying PCM to power dissipating circuits can be used to buffer peak power dissipation, and reduce the maximum temperatures, that would otherwise occur. By acting as a heat buffer PCM may also reduce the temperature variations to which a device, operating in pulse mode, is susceptible.

By providing a suitable quantity of PCM, such that, under normal operating conditions, the PCM remains part liquid and part solid the temperature of the power devices in an electronic system can effectively be clamped at the melting temperature. By clamping the temperature of power devices, thermal stress can be minimized and reliability enhanced.

DETAILED DESCRIPTION OF PREFERRED EMBODIMENTS

In the following description reference is made to the accompanying drawings which form a part hereof, and in which is shown by way of illustration specific embodiments in which the invention may be practiced. It is to be understood that other embodiments may be utilized as structural changes may be made without departing from the scope and inventive concepts of the present disclosure.

Embodiments of the present invention relate, generally, to power dissipation within pulsed power devices, and in particular embodiments to power dissipation within pulsed power devices within portable communication systems.

Power amplification devices, and devices which dissipate significant amounts of power, according to embodiments of-the invention, may be employed in a variety of portable electronic systems. However for the purposes of simplifying this disclosure, preferred embodiments, are described herein with relation to personal communications systems, such as portable phones, wireless phones, two way radios and the like. Further, the disclosure shall, in large part, be described with reference to GaAs MCM's, i.e. Gallium Arsenide Multi-Chip Modules. GaAs MCM's are a common semiconductor configuration for power amplification within portable phone systems. GaAs MCM's generally comprise a substrate on which GaAs power chips are mounted. Such modules are well known in the art and, as such, serve well for illustrative purposes. Those skilled in the art will recognize that the techniques and apparatus, thus illustratively described, are equally applicable to other semiconductor technologies, other device packaging schemes, and other pulse power applications.

The communication systems, described to illustrate preferred embodiments of the present invention, typically include one or more portable units which transmit and/or receive from one or more remotely located transmitter and/or receivers. In many portable communications applications it is desirable to reduce the temperature variations of the internal electronics, for example, to increase reliability.

Figure 1:
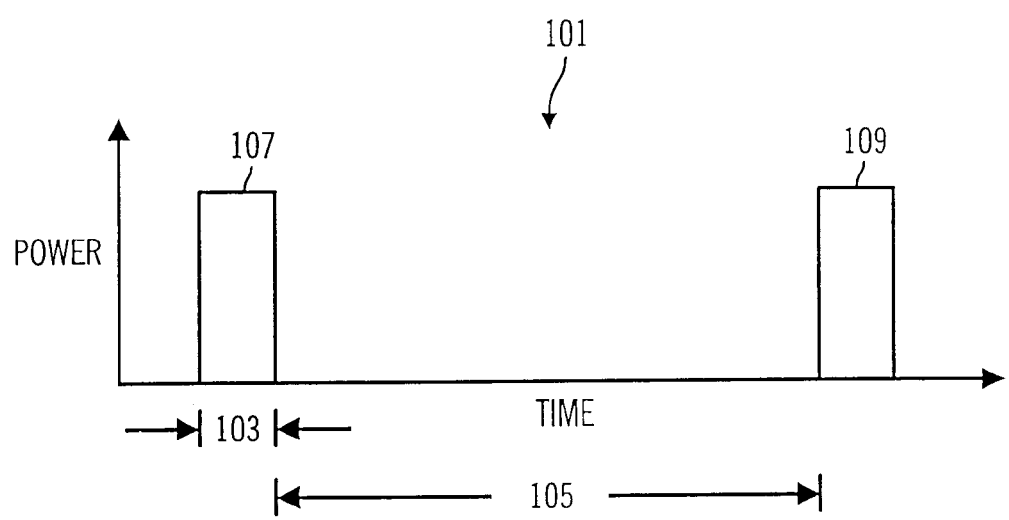
FIG. 1 is a graph of power dissipation vs. time for an example pulsed power system, illustratively the RF (Radio Frequency) broadcast amplifier for a TDMA (Time Division Multiple Access) portable phone.

FIG. 1 is a graph of power dissipation vs. time of an example pulse power system, for example, as may be found in a Time Division Multiple Access (TDMA) portable phone. FIG. 1 is an exemplary graph, showing a power versus time curve, for a typical time division application, such as a TDMA portable phone. FIG. 1 contains a graph, 101, illustrating the timing between successive broadcast pulses 107 and 109. The pulses, 107 and 109 are approximately 600 $\mu$sec wide (103) and are separated by 4.2 milliseconds (105). These illustrative timing values are typical for some Time Division Multiple Access (TDMA) phones, for example those following the GSM (Global System for Mobile communication) standard. The GSM standard employs this timing in order to allow a number of different phones to share the same frequency, without interfering with each other, by allowing each phone to broadcast only in successively allotted time slots. Communications systems, that operate by broadcasting information in such a time sharemanner or "burst mode", are commonplace. In addition many electronic devices, such as pulse lasers, power supplies, radar, television, and many other devices operate, at least partially, in a pulsed format, and may therefore benefit from the inventive concepts within this disclosure.

Figure 2:
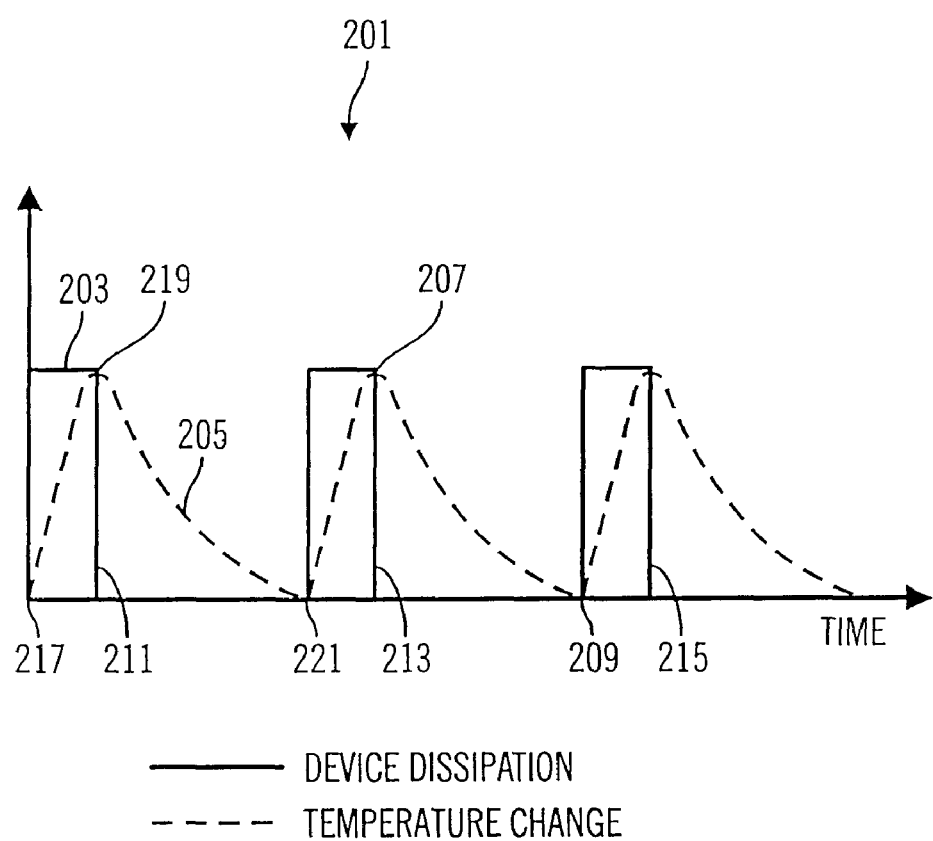
FIG. 2 is a graph showing the relationship between power dissipation and temperature rise in a pulse power device, such as the illustrative example TDMA portable phone of FIG. 1.

FIG. 2 contains a graph, 201, illustratively displaying the relationship between pulse power and temperature rise in a pulsed system, for example the illustrative TDMA phone system of FIG. 1. The TDMA phone system has been chosen as an example embodiment familiar to those skilled in the art. Those skilled in the art will appreciate that the discussion is equally applicable to other systems, such as CDMA phones, PCS phones, portable phones, and other pulsed power applications, both within and outside of the communications arts.

In FIG. 2 the solid waveform, 203, represents the output power level of a pulse power system, for example the illustrative TDMA phone system of FIG. 1. The dashed line 205 represents the temperature change in an output device. The graphs of the output power and temperature rise have been adjusted, so that the relationship between the output pulse power and the temperature rise can be clearly illustrated. The graphs of the output power and temperature rise are used for comparison of the timing between the two, and no absolute vertical scale is intended.

The graph, 201, illustrates three power pulses labeled 211, 213, and 215. Pulse 211 turns on at 217, and turns off at 219. During the period from 217 to 219 the power device is dissipating power. When the pulse turns on at 217, the temperature of a power device within the system, as shown by the dashed temperature line 205, begins to rise. At point 219, the power pulse turns off, no more heat is being added by the power device, and the system begins to cool. The system continues to cool until 221, when pulse 213 turns on. The temperature of the power device once again rises until point 207, at which point pulse 213 turns off. When pulse 213 turns off there is no heat being dissipated by the power device, and the temperature falls until 209, when pulse 215 turns on. FIG. 2 illustrates a system that has been operating for a time period which is sufficiently long as to achieve overall temperature equilibrium. That is the system has been operating long enough so that the temperature rise caused by a power pulse is equal to the temperature decrease during the time when the pulse is absent. FIG. 2 is illustrative of the fact that, even when a pulsed system is operating and has achieved equilibrium, there are temperature excursions within the system, caused by the turning off and on of the power device. Those temperature excursions, which result from the cycling of the power device, may cause thermal stress. Eliminating the temperature excursions, or minimizing them, may have beneficial effects in limiting the range of thermal cycling, and therefore the thermal stress, in operation. A reduced temperature range can reduce mechanical stress on the device, due to those temperature variations, and thereby improve the reliability of the device and the overall system.

Figure 3:
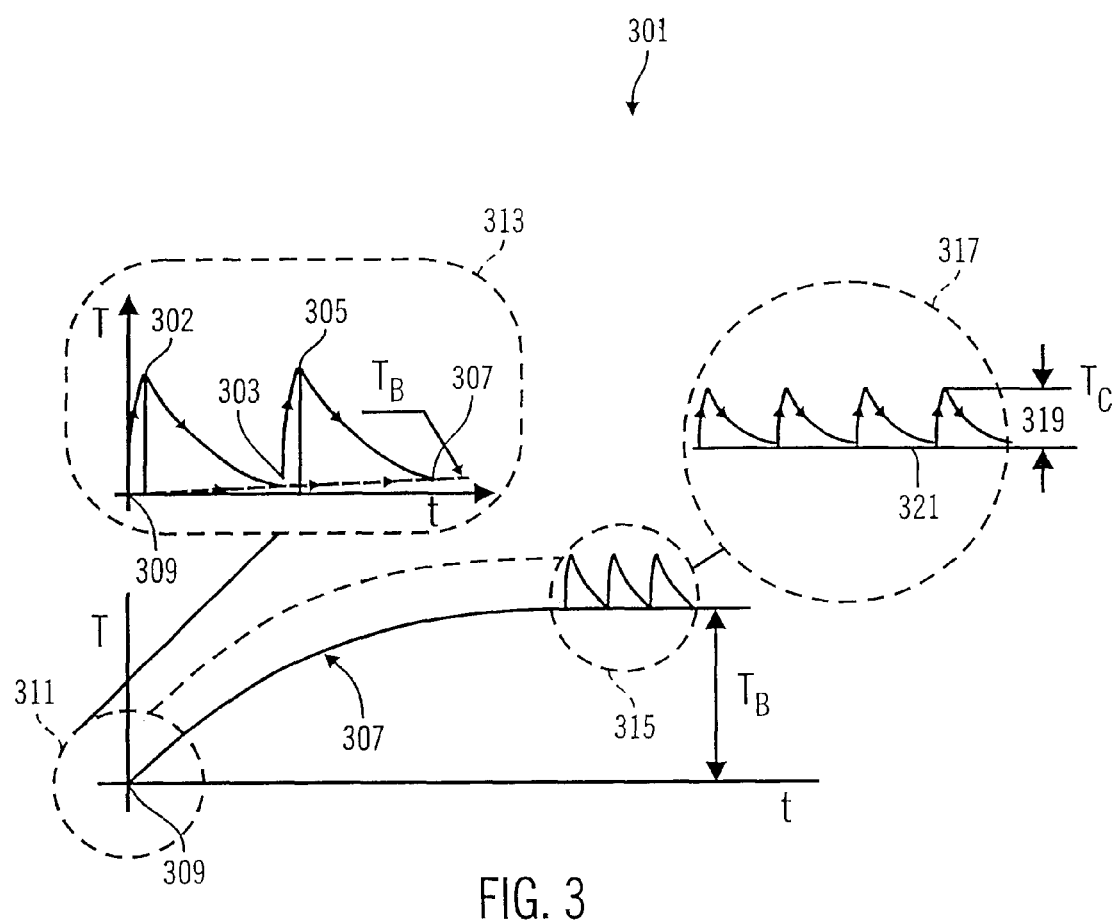
FIG. 3 is a graph of temperature rise versus time for a pulsed power device, such as the illustrative TDMA portable phone of FIG. 1, which illustrates the period between turn on of the device and the device reaching temperature equilibrium.

FIG. 3 illustrates another aspect of the power dissipation and temperature rise of a pulsed power system. The graphs of FIG. 3 illustrate a pulsed system, containing a power device, that has been just turned on and whose temperature is rising from ambient temperature. The graph, 301 represents a power device junction temperature, T, as a function of time. The baseline temperature is the minimum temperature, of the envelope of a device operated in the pulse mode, without embodiments of the invention. The baseline of the device in FIG. 3 is 307. The pulsed system begins operating at time 309, and the junction temperature, T of the power device, begins to rise. The initial temperature rise is illustrated in 313, which is an enlargement of the period immediately after the system has been turned on. In 313 the system turns on at point 309, which represents the turn on of the first power pulse. At point 302 the first power pulse turns off. The junction temperature, T, has reached a maximum at 302. At point 302 no more power is being added, by the power device, and the junction temperature, T, begins to drop. The drop in junction temperature, T, continues until the second power pulse, at point 303, turns on. Once again, while the power pulse is on, the junction temperature T of the power device increases until a point 305, when the power pulse turns off. The junction temperature T continues to fall until a point 307, which is immediately prior to the activation of the third pulse. In addition to the cyclical rising and falling of temperature, as the power device cycles on and off, an increase in baseline temperature 307 occurs. The increase in baseline temperature, 307, occurs because the power device does not have adequate time to cool down to ambient temperature between power on cycles. The result is illustrated in graph 301, and is shown as a rising baseline 307. The baseline, 307, continues to rise until a point is reached where the temperature rise due to the on cycle of the pulsed power device is equal to the temperature fall due to the cooling of the device during the off cycle time of the device. At the point where the overall cooling during the off cycle of the power device is equal to the overall heating during the on cycle of the power device, there will be no further rise in the baseline temperature, TB, as it has reached temperature equilibrium. The baseline temperature equilibrium situation is illustrated by section 315, of curve 307. Section 315 is enlarged in 317 to show detail. In 317, a temperature cycling range, $T_C$–319, due to the turning on and off of the power device, is illustrated. The temperature cycling range $T_C$–319 is superimposed upon the baseline temperature $T_B$–321. The overall peak power device temperature is $T_C+T_B$, that is the temperature cycling range $T_C$–319 plus the baseline temperature, $T_B$–321.

Figure 4:
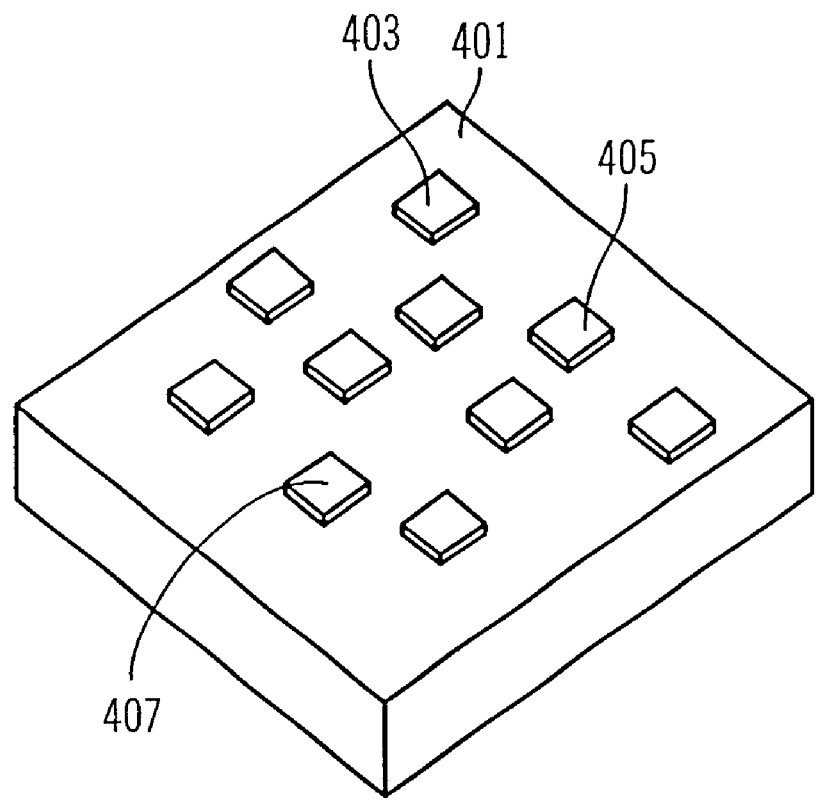
FIG. 4 is a layout drawing of a multichip module, of the type that may be found in a portable phone.

FIG. 4 is an drawing of the type of a multichip module of the type that is used illustratively within the present disclosure. Localized power sources, 403, 405, and 407 are semiconductor dies, such as GaAs power chips, which are mounted on the device side of a substrate 401. The reverse side of the substrate is the mounting side and is used for attachment to a support surface, such as a printed circuit board. This multichip module arrangement is commonly found in portable phones, and is used to illustrate embodiments of the present invention.

Figure 5:
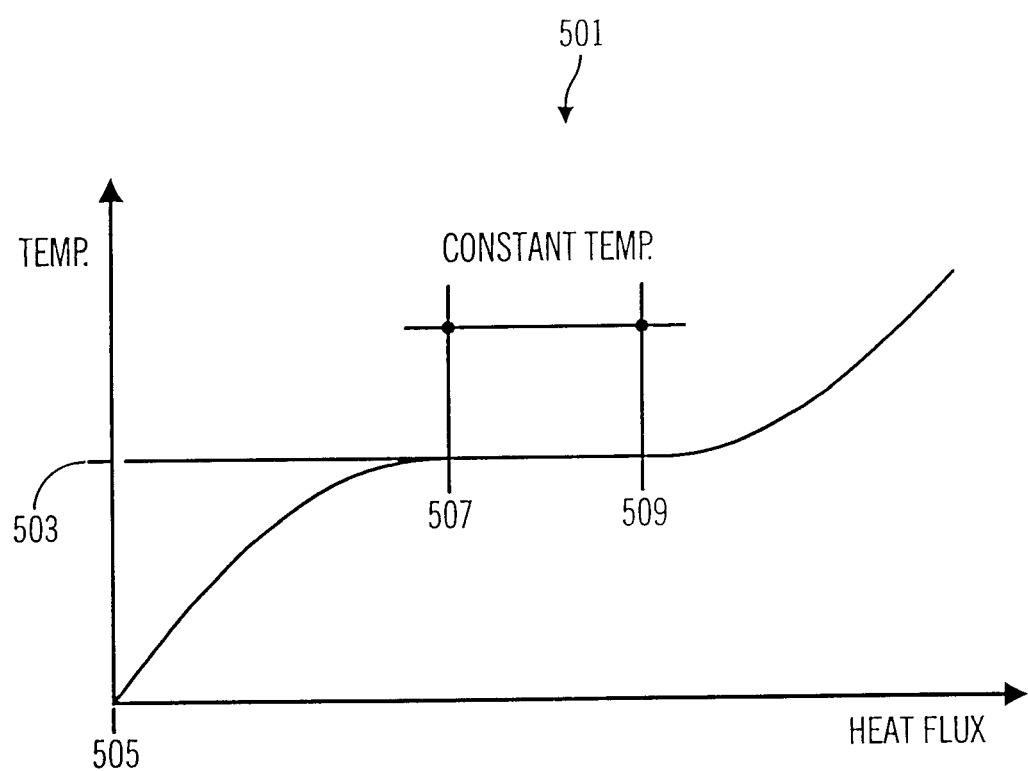
FIG. 5 is a graph of temperature rise vs. heat flux of a PCM material, showing a constant temperature region that accompanies a change of PCM from a solid state to a liquid state.

FIG. 5 contains a graph, 501, of temperature rise vs. heat flux of a Phase Change Material PCM. A phase change material is a material which can absorb a substantial amount of heat, as it changes from a solid form to a liquid form, with no change in temperature. The graph 501, of FIG. 5 illustrates the characteristics of a PCM material. The graph 501, displays temperature on the vertical scale verse heat flux on the horizontal scale. As the material heats up, in the region between 505 and 507, the PCM shows an increase in temperature. When the PCM reaches the temperature 503, the material begins a transformation into the liquid state. As the material absorbs more heat, in the area of the graph shown between 507 and 509, the PCM is in various stages of liquefaction but no resulting increase in temperature occurs. At 509 the material has completely liquefied and, from that point, the temperature increases as more heat is applied. The region 507 to 509 shows the constant temperature region that accompanies a change of PCM from the solid state to the liquid state. It is the ability of PCM materials to absorb heat in this region, without temperature change, that makes PCM materials advantageous in the present disclosure. PCM materials are available in a variety of melting temperatures. PCM materials are also available in microcapsule form. In microcapsule form PCM material is enclosed within small capsules, or spheres. An example of such microencapsulated PCM material is that Produced by Frisby Technologies, Inc. of Winston-Salem, N.C. Frisby Technologies presently produces microcapsules which are 15–40 microns in diameter with melting temperatures from 43° F. to 214° F. Other companies produce other versions of this material.

In preferred embodiments of the invention, the PCM material, in various forms, is coupled thermally to the pulsed power source. By choosing the correct temperature PCM, the material can buffer temperature cycling changes in pulse power systems. The mechanism by which the PCM buffers and limits temperature changes, and thereby temperature stress, is more fully illustrated in the description of the graphs in FIG. 12.

Figure 6:
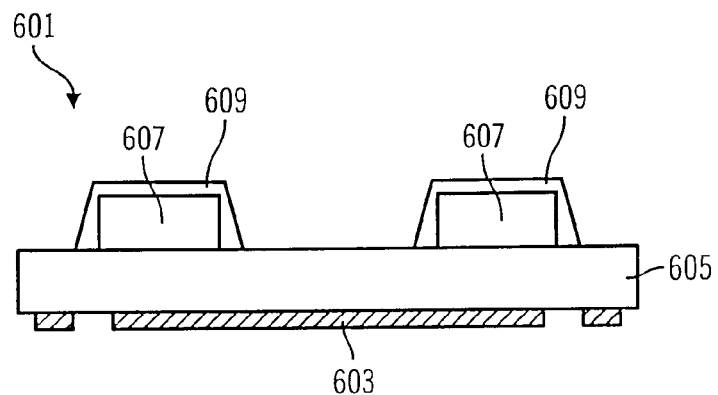
FIG. 6 is a cut away view of a GaAs multichip module.

FIG. 6 shows a cut away view 601 of a GaAs multichip module, as may be found in a pulse power application such as a portable phone. The GaAs semiconductor is used illustratively, as an example that may be familiar to those skilled in the art. The same principles may, however, apply to any semiconductor device. The GaAs Device, 607, is mounted on the device side of the substrate 605. The substrate 605 is attached to the circuit board, on the mounting side of the substrate opposite the device side of the substrate. The substrate, in this instance, it is mounted via a solder joint 603. The GaAs Device, 607, may also be covered by a thermally conductive material 609.

Figure 7:
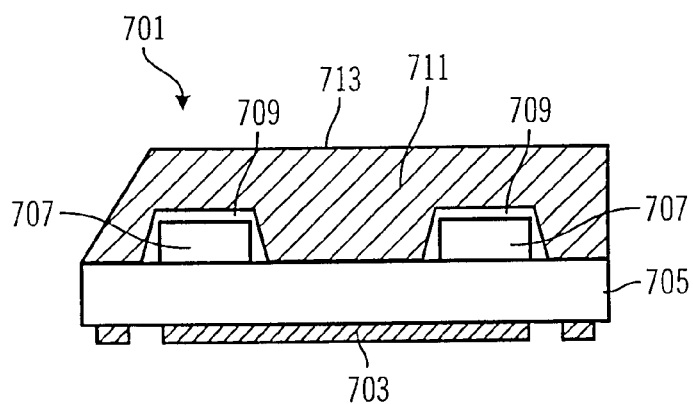
FIG. 7 is a cut away view of a GaAs multichip module, according to a first embodiment of the invention.

FIG. 7 is shows a similar multichip module, however, including aspects a first preferred embodiment of the invention. FIG. 7 shows a cut away view 701 of a GaAs multichip module, as may be used in a pulse power application, such as a portable phone. The GaAs device, 707 is mounted on a substrate 705. The substrate is attached to the circuit board upon which it is mounted via a solder joint 703. The GaAs Device, 707, may also be covered by a thermally conductive material 709. The substrate 705 and GaAs devices, e.g. 707, are sealed within a case 713. The case 713 serves to contain a quantity of PCM, of the proper melting point for the application, thereby thermally coupling it with the GaAs devices, e.g. 707. In the illustrated embodiment, the thermal contact with the GaAs devices, is made through thermally conductive material, 709, which covers the actual devices, 707. In other embodiments the thermal coupling may be achieved directly without a thermally conducting material layer, 709. The thermally conductive material may be included to facilitate thermal coupling of the semiconductor device, 709 to the PCM material 711. It may have a variety of shapes in order to enhance the thermal coupling between the semiconductor device, e.g. 707, and the PCM material 711. Some embodiments may, however, eliminate the thermally conductive material entirely and instead thermally couple the semiconductor device, e.g. 707, directly to the PCM material 711.

Figure 8:
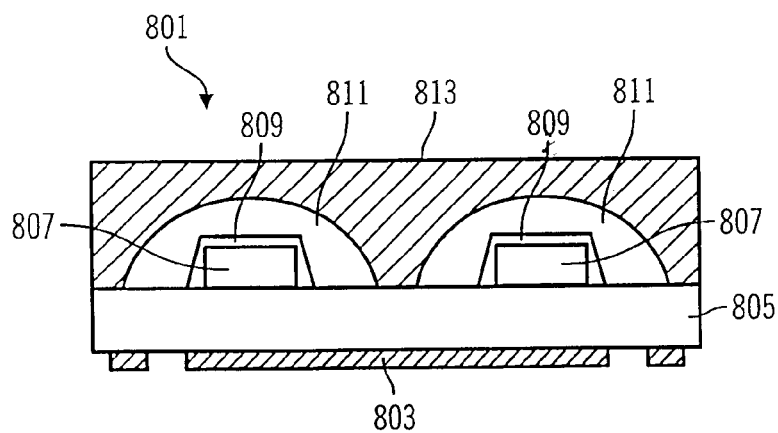
FIG. 8 is a cut away view of a GaAs multichip module according to a second embodiment of the invention.

FIG. 8 shows multichip module according a second preferred embodiment of the invention. FIG. 8 shows a cut away view 801 of a GaAs multichip module, again as may be found in a pulse power application, such as a portable phone. The GaAs device, 807, is mounted on a substrate 805. The substrate is attached to the circuit board upon which it is mounted via a solder joint 803. The GaAs Device, 807, may also be covered by a thermally conductive material 809. The thermally conductive material, 809, may then be covered by a die overcoating, 811, of PCM. Such an overcoating, 811, is commonly referred to as a die gell. The die overcoating, 811, of PCM may also be applied directly over the semiconductor die, 807 in the case where the thermally conductive material layer, 809, has been eliminated. The substrate 805 and GaAs devices, e.g. 807, are sealed within a case 813. The case 813 is molded so as to cover PCM, which has been deposited upon power dissipating GaAs devices, e.g. 807.

Figure 16A:
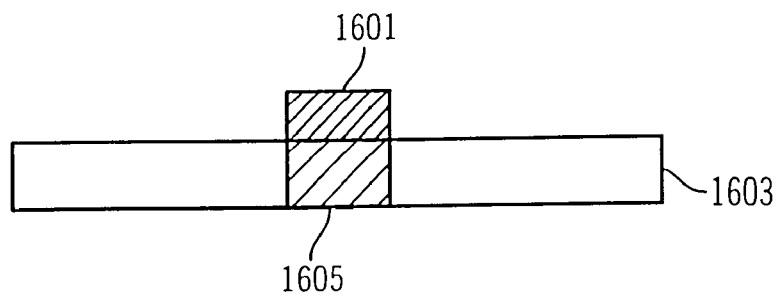
FIG. 16a is a cross sectional drawing of PCM material situated in a substrate and thermally coupled to a semiconductor device, according to an embodiment of the present invention.

In addition to covering semiconductor devices with PCM, as shown in FIG. 7 and FIG. 8, PCM material may also be disposed in or below a mounting substrate as shown in FIG. 16A. In FIG. 16A a semiconductor device, 1601, is shown supported by a substrate 1603. The volume immediately beneath a semiconductor device, 1605, contains PCM. The thermal coupling between the mounting surface of the semiconductor device, 1601, and the PCM material, 1605, may transfer heat into the PCM material, where it may be absorbed when the PCM changes from a solid to liquid.

Figure 16B:
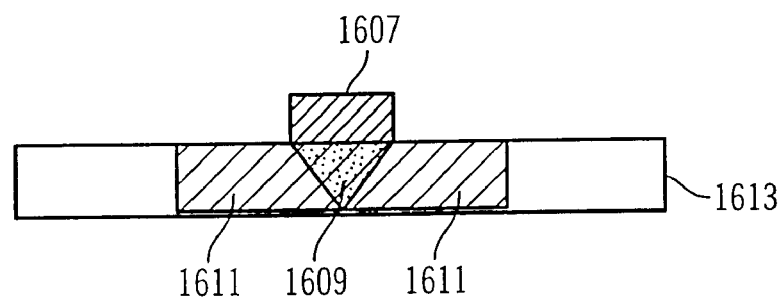
FIG. 16b is a cross sectional drawing of a heat spreading mounting thermally coupled to PCM material and a semiconductor device, according to an embodiment of the present invention.

In the further exemplary embodiment of FIG. 16B, a semiconductor device, 1607, may be thermally coupled to a heat spreading mounting 1609. The heat spreading mounting, 1609, may comprise various thermally conductive media such as copper, silver, aluminum, diamond, or other conductive material, and may be embedded in the substrate, 1613, which supports the semiconductor device, 1607. The heat spreading mounting, 1609, may also be formed into a variety of shapes, for improved thermal coupling to the PCM material, depending on the application. The heat from the semiconductor device, 1607, may be coupled into the heat spreading mounting 1609, and then further coupled to the PCM material 1611.

Figure 16C:
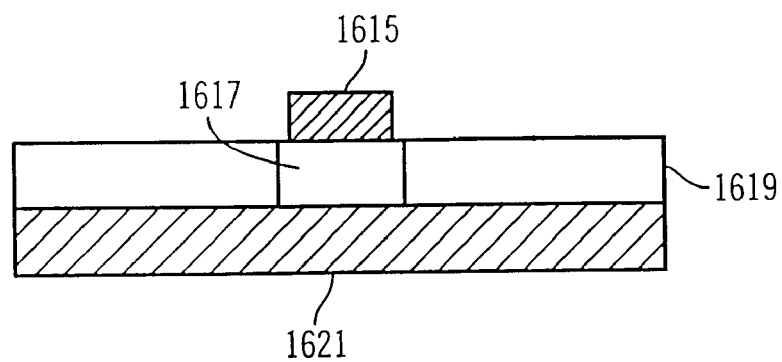
FIG. 16c is a cross sectional drawing of PCM material thermally coupled to a semiconductor device through a thermal via in a substrate, according to an embodiment of the present invention.

A further exemplary embodiment of the invention is illustrated in FIG. 16C. FIG. 16C shows a semiconductor device, 1615, supported by a substrate 1619. Within the substrate 1619, and thermally coupled to the semiconductor device is a thermal via, 1617. The thermal via, 1617, may comprise various thermally conductive media such as copper, silver, aluminum, diamond, or other conductive material. The thermal via 1617, can couple heat from the semiconductor device, 1615, through the thermal via, and further into the PCM layer below. In such a manner, a substantial amount of PCM material, 1621, may be thermally coupled to the semiconductor, 1615, through the thermal via 1617. Such an arrangement may be useful in thermal clamping mechanisms, in which a quantity of PCM is used to buffer any temperature changes of the semiconductor device, 1615, during operation.

Those skilled in the art will readily perceive that the techniques of FIG. 16A, FIG. 16B, and FIG. 16C, may be applied to single semiconductor embodiments, or to multiple semiconductor embodiments, such as may be found in multichip modules.

Figure 9:
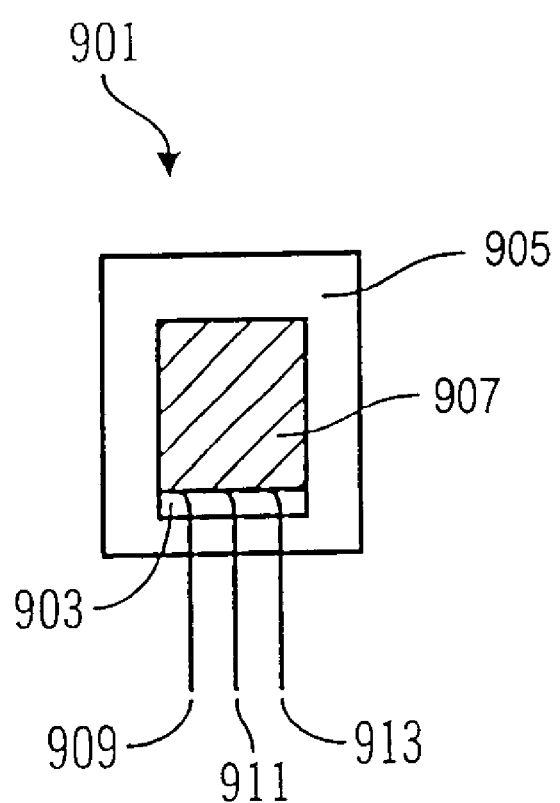
FIG. 9 is an layout of a transistor according to an embodiment of the present invention.

FIG. 9 shows a transistor according to another preferred embodiment of the disclosure. 901 is a transistor containing three wire leads, 909, 911, and 913. The wire leads are attached via wire bonds to the power semiconductor device, 903. The molded epoxy case 905, which encloses the device, contains a volume 907 of PCM material. The PCM material can act as a heat buffer, thereby reducing thermal stress on the device, in pulse power applications.

Figure 10:
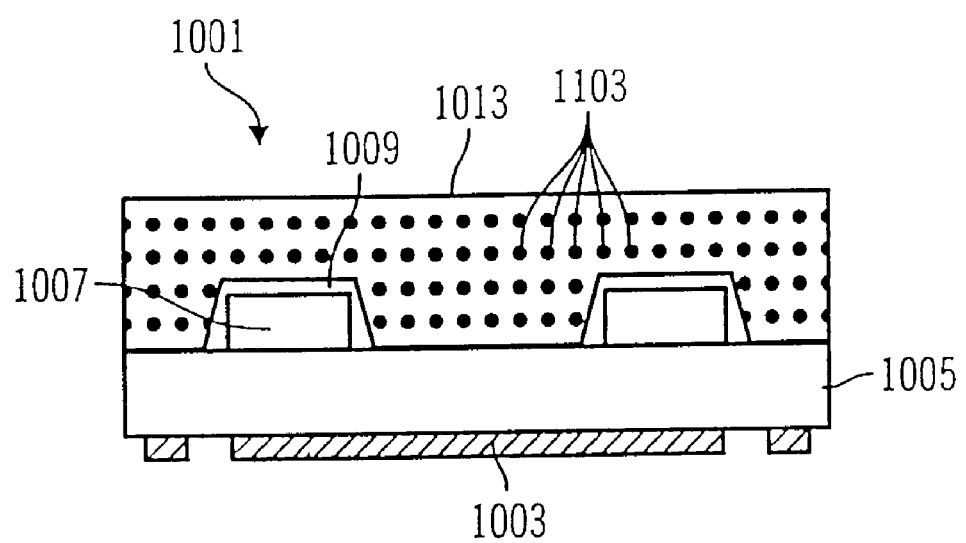
FIG. 10 is an layout drawing of a GaAs multichip according to an embodiment of the present invention, in which the PCM is contained within spheres embedded in the covering of a multichip module.

FIG. 10 shows a multichip module according to a further embodiment of the invention FIG. 10 shows a cut away view 1001 of a GaAs multichip module, again as may be found in a pulse power application, such as a portable phone. The GaAs Device, 1007, is mounted on a substrate 1005. The substrate is attached to the circuit board upon which it is mounted, via a solder joint 1003. The GaAs device, 1007, may also be covered by a thermally conductive material 1009. The substrate 1005 and and GaAs devices, e.g. 1007, are sealed within a case 1013. The case 1013 is molded from material which contains PCM material in the form of microcapsules. The PCM material is embedded in the materials which comprise the device cover. By adding PCM to molding material, such as epoxy, that is commonly used to cover a power device, a temperature buffering feature can be built directly into the packaged device.

Figure 11:
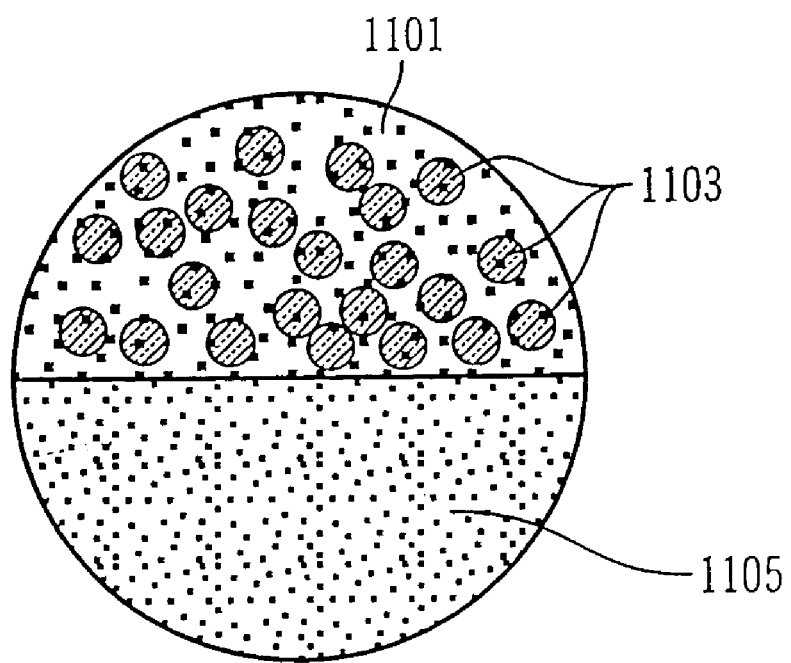
FIG. 11 is an enlarged layout drawing of FIG. 10, showing PCM spheres within the carrier material, which forms a multichip module cover, and also illustrating a thermal coupling of the multichip module cover with a high thermal conductivity material.

FIG. 11 contains a magnified view of the device disclosed in FIG 10. The PCM spheres, 1103 are embedded in a PCM carrier material, such as device molding epoxy, and is thermally coupled with the high thermal conductivity material 1105, shown as item 1009, in FIG. 10.

Adding microcapsules containing PCM to a material that is used to encase power semiconductor devices can be a way to buffer those devices against thermal stresses which are seen in operation. In addition devices with layers of different temperature microcapsules can be formed. Such devices can relieve some of the thermal stress that is encountered by devices operating in pulse mode, at two or more temperatures, such as portable phones which may operate at a variety of power outputs.

Figure 12:
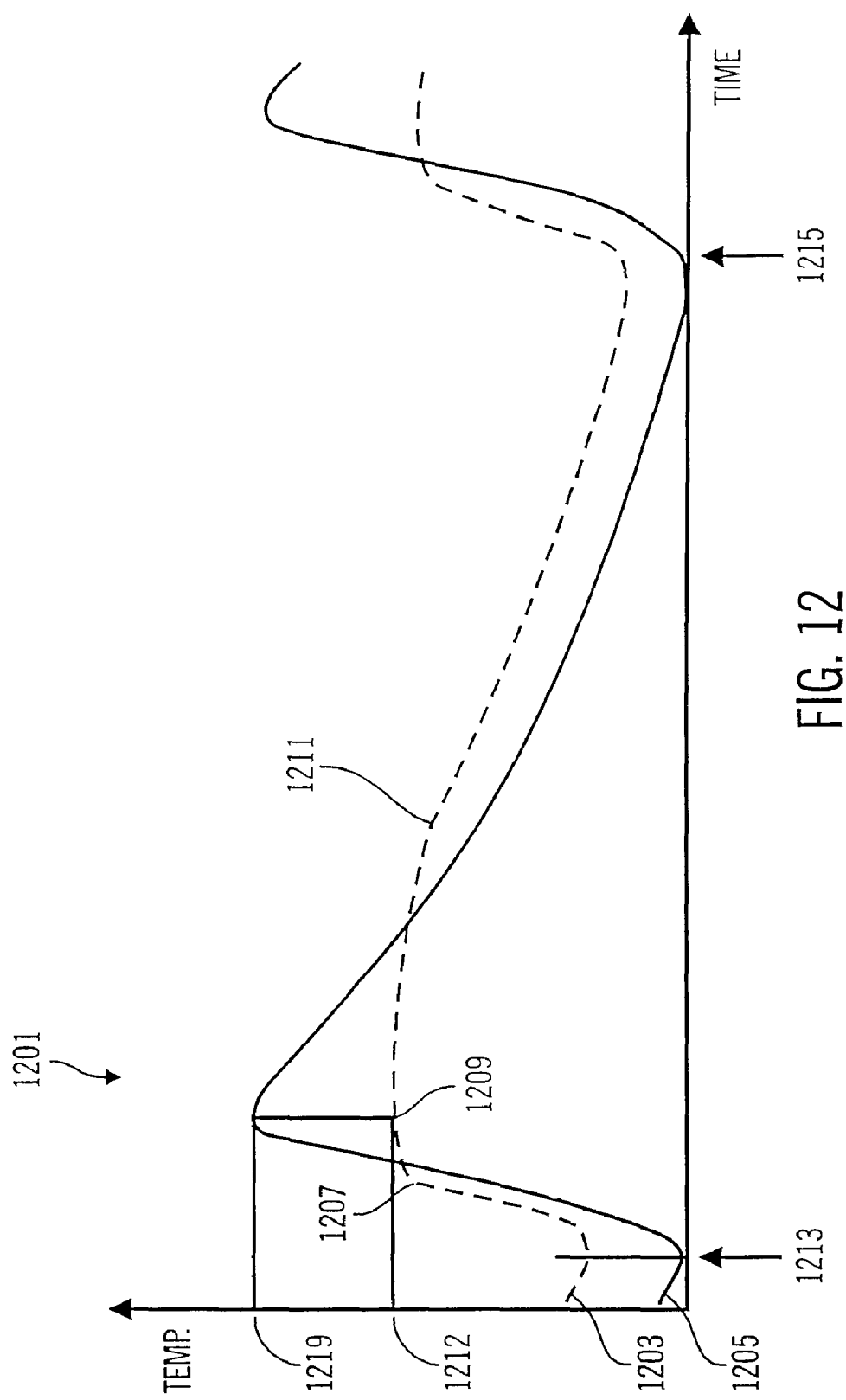
FIG. 12 is a graph of the temperatures, at operating equilibrium, for a standard power device and a device according to an embodiment of the present disclosure.

FIG. 12 graphically depicts the method by which PCM; thermally coupled to a device, can buffer and minimize operational temperature excursions during pulse power operation. The Solid curve, 1205, represents a power device without any PCM material. The dashed curve 1203 represents the same power device, which has been thermally buffered by an appropriate amount of PCM. The PCM melts at temperature 1207. The power devices turn on at the same time, 1213, and temperature within both devices, as shown by both curves, begins to rise. At point 1207 the PCM material in the device begins to melt absorbing the heat of the power device. The PCM material continues to melt until point 1209, when the power devices of both curves turn off and the device begins to cool. The power device without PCM, represented by the solid curve, also begins to cool at 1209 when the power device turns off. The temperature of the power device without PCM is 1219, when the power device without PCM turns off. The PCM buffered device also turns off at 1209, but its temperature is limited to 1212 because the melting PCM has absorbed the additional heat. At point 1209, when the active power devices turn off, the temperature of both devices begins to fall. The temperature of the device, unbuffered by PCM, falls faster because the PCM material begins to release heat when its power device turns off. The PCM buffered device temperature continues to fall at a slower rate until 1211, at which point the PCM has all solidified and both devices cool at similar rates, as shown in the graph. The device containing the PCM experiences less of a peak temperature because the PCM absorbs heat when melting. The device containing the PCM also experiences a higher minimum temperature on the cooling cycle, because the solidifying of the PCM material releases heat, preventing the temperature from falling as far as the device without PCM. Because there is less differential between the maximum and minimum temperatures during normal operation of the device containing the PCM buffer, there is less thermal stress on the device, hence the device can be more reliable. In addition some manufacturers produce PCM whose solid and liquid volumes are essentially equal, thereby further eliminating stress that might come from thermal cycling. In addition the peak temperature of the buffered device is reduced, thereby providing an additional margin of safety over the non PCM buffered device in terms of device safe operating area.

The greater amount of PCM within the device the greater the amount of buffering. An addition of a sufficient amount of PCM within a device, such that the power device would achieve a temperature equal to the melting point of the PCM, but containing an amount of PCM so large that the device could not melt all of the PCM could result in a "thermal clamp". The pulse power device would experience temperature variations during the time the device were attaining equilibrium temperature, but once the device attained equilibrium temperature variations would essentially be buffered into minor variations by the melting and solidifying of the PCM. A situation where PCM is used as a thermal clamp is illustrated in FIG. 13*a* and FIG. 13*b*.

Figure 13A:
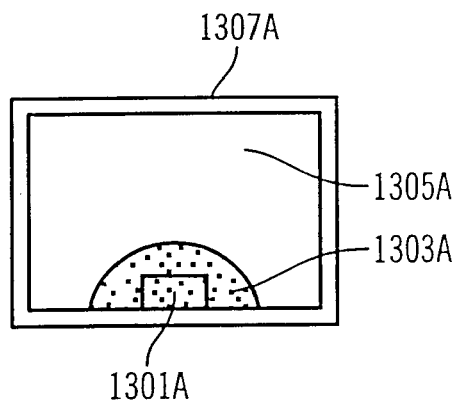
FIG. 13a is a cross sectional drawing of a PCM thermally clamped device, which is illustrated at the end of the off portion of its on/off cycle.
Figure 13B:
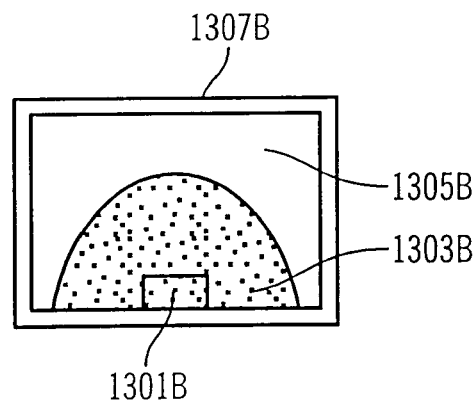
FIG. 13b is a cross sectional drawing of a PCM thermally clamped device, which is illustrated at the end of the on portion of its on/off cycle.

FIGS. 13*a* and 13*b* show the same PCM thermal clamp at two different time periods. FIGS. 13*a* and 13*b* shows a container, 1307*a* and 1307*b*, containing solid PCM, 1305*a* and 1305*b*, and liquid PCM, 1303*a* and 1303*b*. FIG. 13*a* shows the semiconductor device, 1301*a*, at the end of the off portion of its on/off duty cycle. The liquid PCM 1303*a* is at its minimum, because the device is at the end of its cooling portion of its pulse cycle. FIG. 13*b* shows the same device, labeled 1301*b* for comparison, which is at the end of the on portion of its on/off duty cycle. The liquid PCM 1303*b* is at its maximum, because the device is at the end of its power dissipating portion of its pulse cycle. When the liquid PCM has reached it's maximum proportion, 1303*b*, of the total volume of the PCM the PCM will be able to conduct more heat than when the amount of liquid PCM was at it's minimum, 1303*a*. The PCM in liquid form can conduct more heat away in the liquid from because of its greater thermal conductivity as a liquid, and because cooling mechanisms such as convection currents may operate. This increased cooling allows the apparatus to conduct more heat when it is absorbing heat, thus allowing temperature clamping even below the device's baseline temperature.

Figure 14:
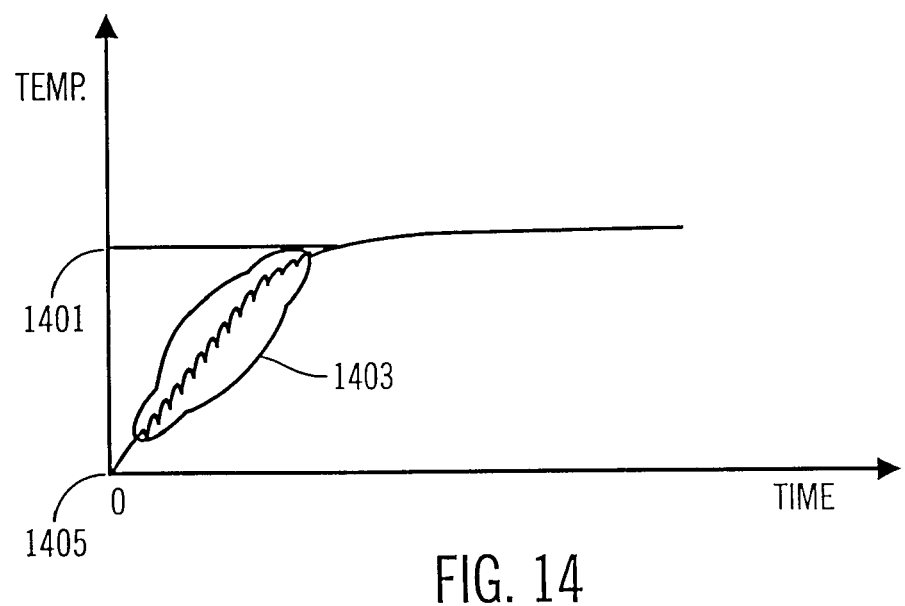
FIG. 14 is a graph of temperature versus time for a PCM thermal clamp device, such as the one presented in FIG. 13a and FIG. 13b.

FIG. 14 is a graph of the device temperature of the thermal clamp, which is shown in FIG. 13*a* and FIG. 13*b*. The pulse power system is turned on at time 0, when the ambient temperature of the system is 1405. The device goes through a series of off and on cycles as depicted in 1403. During the period 1403 the device temperature continues to rise and fall, with the overall temperature continually increasing. The device temperature continues to incrementally increase until the device temperature reaches the melting point, 1401, of the PCM material. When the device temperature reaches the melting point of PCM, the temperature stops rising as the melting PCM absorbs the additional heat. If the PCM absorbs enough heat so that it can release an adequate amount of heat during the off cycle of the pulse device the temperature will not fall below 1401. In such a case all the energy dissipated by the device will be either radiated into the environment or absorbed by the phase change of the PCM, and the temperature of the device will remain essentially constant. The device will, essentially, be thermally clamped.

Figure 15:
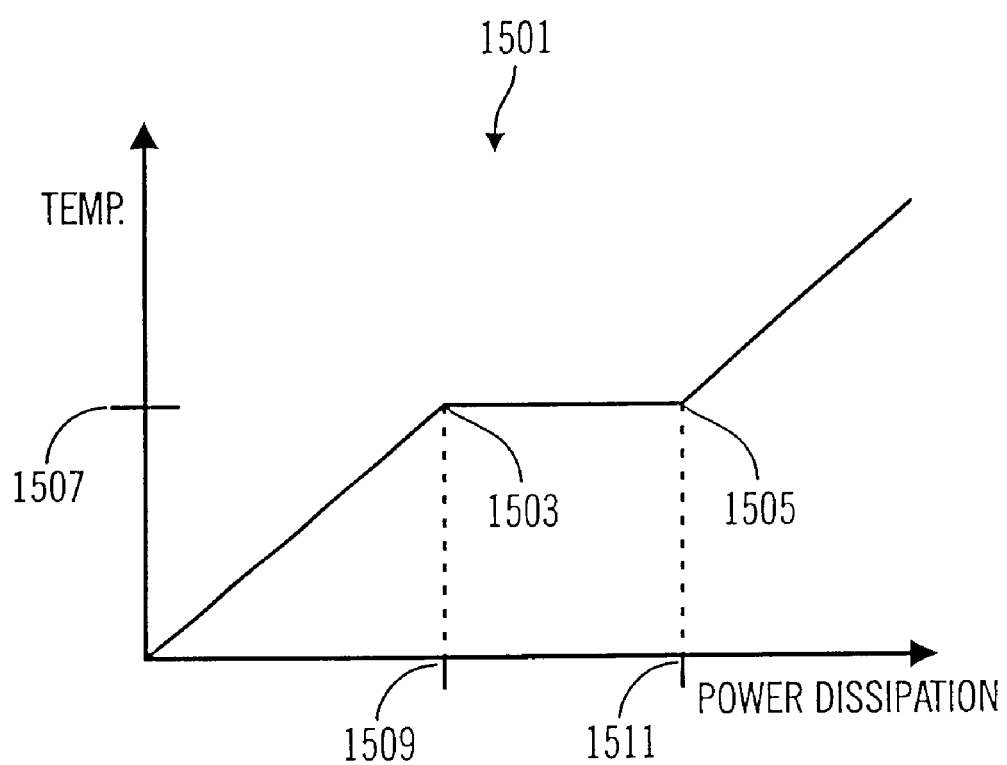
FIG. 15 is a graph of temperature vs. power dissipation of a device thermally coupled to a PCM.

FIG. 15 contains a temperature verses power dissipation graph, 1501, which further illustrates thermal clamping of devices buffered with PCM. As the power dissipation of the device increases, the temperature rises until a temperature point 1507, at which the PCM material, which is thermally coupled to the power device, melts. The PCM will continue to absorb heat, until a point is reached, 1505, where all of the PCM has liquefied, and the PCM can no longer absorb the heat into a phase change.

The thermal clamp is therefore operable at power dissipation levels between 1509 and 1511. As long as the steady state power dissipation is maintained within the range of power dissipation between 1509 and 1511, the temperature of the power device will remain essentially constant, thereby reducing thermal stress and enhancing reliability, during the operation of the device.

The foregoing description of the exemplary embodiments of the present disclosure has been presented for the purposes of illustration and description. It is not intended to be exhaustive or to limit the inventive concepts to the precise embodiments disclosed. Many modifications and variations are possible in light of the above teaching. It is intended that the scope of the invention be limited not with this detailed description, but rather by the claims appended hereto, which appear below.

We claim:

1. An apparatus for minimizing thermal excursions, the apparatus comprising:
   a semiconductor device, operating at temperature equilibrium and in a pulse mode, the pulse mode comprising an on period and an off period, for which thermal excursions are to be minimized; and
   a PCM material, thermally coupled to the semiconductor device, whereby the PCM material absorbs heat, from the semiconductor device, during the on period, by changing from a solid state to a liquid state and whereby the PCM material supplies heat, to the semiconductor device, during the off period by changing from a liquid state to a solid state.

2. An apparatus as in claim 1 wherein an amount of PCM thermally coupled to the semiconductor device is of sufficient quantity such that a portion of the PCM material, the portion being less than 100%, remains liquefied at all times when the semiconductor device is operating at temperature equilibrium.

3. An apparatus as in claim 1 wherein the semiconductor device is a Gallium Arsenide semiconductor device.

4. An apparatus as in claim 1 wherein the melting temperature of the PCM material is lower than a peak operating temperature of the semiconductor device when the semiconductor device is operating without PCM and is at temperature equilibrium and wherein the melting temperature of a PCM material is higher than the baseline operating temperature of the semiconductor device when the semiconductor device is operating without PCM and is at temperature equilibrium.

5. An apparatus as in claim 1 wherein a melting temperature of the PCM material is lower than a baseline operating temperature of the semiconductor device when the semiconductor device is operating without PCM and is at temperature equilibrium.

6. An apparatus as in claim 1 wherein the PCM material occupies an essentially constant volume when changing from the solid state to the liquid state.

7. The apparatus of claim 5 wherein the melting temperature of the PCM material is lower than a peak operating temperature of the semiconductor device when the semiconductor device is operating without PCM and is at temperature equilibrium and wherein the melting temperature of the PCM material is higher than the baseline operating temperature of the semiconductor device when the semiconductor device is operating at temperature equilibrium.

8. An apparatus as in claim 5 wherein an amount of PCM thermally coupled to the semiconductor device is of sufficient quantity such that a portion of the PCM material, wherein the portion is less than 100%, remains liquefied at all times when the semiconductor device is operating at temperature equilibrium.

9. An apparatus as in claim 5 wherein the melting temperature of the PCM material is lower than a peak operating temperature of the semiconductor device when the semiconductor device is operating without PCM and is at temperature equilibrium, and wherein the melting temperature of the PCM material is higher than the baseline operating temperature of the semiconductor device when the semiconductor device is operating without PCM and is at temperature equilibrium.

10. An apparatus as in claim 8 wherein the melting temperature of the PCM is chosen to be below the baseline temperature of the same semiconductor device operating without PCM and is at a temperature equilibrium condition, operating without any PCM coupling.

11. The apparatus of claim 1 further comprising:
    a container for containing the semiconductor device, and the PCM, whereby the PCM is thermally coupled to the device.

12. An apparatus for minimizing thermal stress, the apparatus comprising:
    a substrate for supporting a semiconductor device, the substrate comprising a mounting side for attachment to a support surface and a device side for attaching the semiconductor device, the semiconductor device operated in a pulse mode; and
    mounted on the device side of the substrate; and
    a PCM material, thermally coupled to the semiconductor device, for absorbing heat from the semiconductor device by melting, during an on period of the pulse mode, and for supplying heat to the semiconductor device by solidifying, during an off period of the pulse mode.

13. An apparatus as in claim 12 wherein the PCM material is thermally coupled to the semiconductor device by placing an amount of PCM, sufficient to cover the semiconductor device, in such as manner as it covers the device.

14. An apparatus as in claim 12 wherein the PCM material is thermally coupled to the semiconductor device by placing an amount of PCM, sufficient to cover the semiconductor device, in such as manner as it covers the semiconductor device and also covers the device side of the substrate.

* * * * *